United States Patent
Boerstler et al.

(10) Patent No.: US 7,493,229 B2
(45) Date of Patent: Feb. 17, 2009

(54) ADJUSTING VOLTAGE FOR A PHASE LOCKED LOOP BASED ON TEMPERATURE

(75) Inventors: David W. Boerstler, Round Rock, TX (US); Nathaniel R. Chadwick, Burlington, VT (US); Eskinder Hailu, Austin, TX (US); Kirk D. Peterson, Jericho, VT (US); Jieming Qi, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/780,498

(22) Filed: Jul. 20, 2007

(65) Prior Publication Data

US 2009/0024349 A1 Jan. 22, 2009

(51) Int. Cl.
*G01K 3/00* (2006.01)
*G06F 15/00* (2006.01)
(52) U.S. Cl. .......................... 702/132; 700/299; 331/66
(58) Field of Classification Search ............. 702/64–65, 702/99, 104, 130, 132; 700/295, 299–300; 374/1, 100–101; 331/176, 66
See application file for complete search history.

(56) References Cited

U.S. PATENT DOCUMENTS

| | | | |
|---|---|---|---|
| 5,285,116 A * | 2/1994 | Thaik .......................... 326/21 |
| 5,602,462 A * | 2/1997 | Stich et al. ................... 323/258 |
| 5,938,677 A * | 8/1999 | Boukhny et al. ............. 606/169 |
| 6,043,718 A | 3/2000 | Diniz et al. |
| 6,356,515 B1 * | 3/2002 | Kumita et al. ............. 369/13.26 |
| 6,651,202 B1 * | 11/2003 | Phan ........................... 714/733 |
| 6,718,474 B1 * | 4/2004 | Somers et al. .............. 713/322 |
| 6,809,602 B2 | 10/2004 | Boerstler |
| 6,959,258 B2 | 10/2005 | Smith et al. |
| 2004/0063414 A1 * | 4/2004 | Kasperkovitz .............. 455/260 |
| 2006/0223454 A1 * | 10/2006 | Westwick et al. ............. 455/76 |
| 2006/0253204 A1 * | 11/2006 | Papanikolaou et al. ......... 700/1 |
| 2007/0155341 A1 * | 7/2007 | Haiut .......................... 455/75 |

OTHER PUBLICATIONS

"Using Thermal Diodes in the PowerPC970MP® Processor", IBM Corporation, Jul. 2006, pp. 1-8.
U.S. Appl. No. 11/458,753, filed Jul. 20, 2006, Boerstler et al.

* cited by examiner

*Primary Examiner*—Eliseo Ramos Feliciano
*Assistant Examiner*—Mary C Baran
(74) *Attorney, Agent, or Firm*—Stephen J. Walder, Jr.; Matthew B. Talois (57) ABSTRACT

A mechanism for utilizing a single set of one or more thermal sensors, e.g., thermal diodes, provided on the integrated circuit device, chip, etc., to control the operation of the integrated circuit device, associated cooling system, and high-frequency PLLs is provided. By utilizing a single set of thermal sensors to provide multiple functions, e.g., controlling the operation of the integrated circuit device, the cooling system, and the PLLs, silicon real-estate usage is reduced through combining circuitry functionality. Moreover, the integrated circuit device yield is improved by reducing circuitry complexity and increasing PLL robustness to temperature. Furthermore, the PLL circuitry operating range is improved by compensating for temperature.

13 Claims, 5 Drawing Sheets

FORMULA FOR LINE : y=mx+b
m=(y2-y1)/(x2-x1)
b=y-mx
IN THIS CASE:
y1=V1 : y2=V2
x1=T1 : x2=T2
THEREFORE:
T?=(Vread-b)/m

ADJUSTING VOLTAGE FOR A PHASE LOCKED LOOP BASED ON TEMPERATURE

BACKGROUND

1. Technical Field

The present application relates generally to an integrated circuit device. More specifically, the present application is directed to a system and method for adjusting a voltage for a phase locked loop (PLL) based on temperature. The apparatus and method may be implemented in an integrated circuit device, such as a processor or the like, to both control cooling systems and the voltage of the PLL using a single thermal diode or temperature monitoring device.

2. Description of Related Art

Thermal diodes are often provided in integrated circuit devices to monitor the operating temperature of the integrated circuit device. The thermal diode measures the temperature of the integrated circuit device which is then monitored by a monitoring device, such as a monitoring circuit, system-on-a-chip, or the like, to control operation of the integrated circuit device and/or cooling systems, such as fans or other cooling systems. In this way, dangerous temperature conditions of the integrated circuit device may be avoided by detection and modification of operation of the integrated circuit device and/or cooling systems associated with the integrated circuit device.

Another device typically provided in integrated circuit devices is a phase locked loop. A phase locked loop (PLL) is a closed loop feedback control system that generates an output signal in relation to the frequency and phase of an input, or reference, signal. The PLL automatically responds to the frequency and phase of the input signal by raising or lowering the frequency of a controlled oscillator until it is matched to the reference in both frequency and phase. PLLs are widely used in computing devices, telecommunications systems, radio systems, and other electronic applications where it is desired to stabilize a generated signal or to detect signals in the presence of noise. Since an integrated circuit can hold a complete PLL, the use of PLLs in modern electronic devices is widespread.

PLLs generally include a phase detector circuit, a low pass filter circuit, and a voltage controlled oscillator (VCO) placed in a negative feedback configuration. In addition to these elements, a frequency divider circuit may be provided in the feedback path, the reference signal path, or both, in order to make the PLL's output signal an integer multiple of the reference signal. The phase detector compares the phase of two inputs and outputs a corrective signal to control the VCO such that the phase difference between the two inputs becomes zero. The two inputs are a reference signal and the divided output of the VCO.

Various types of phase detector circuits are known including simple OR gates, four-quadrant multiplier (or "mixer") circuits, proportional phase detector circuits, and the like. A more complex phase detector uses a simple state machine to determine which of the two signals has a zero-crossing earlier or more often. This brings the PLL into lock even when it is off frequency. This type of phase detector circuit is known as a phase frequency detector (PFD).

The VCO is used to generate a periodic output signal. For example, if the VCO is at approximately the same frequency as the reference signal, and if the phase of the VCO falls behind the phase of the reference signal, the phase detector circuit causes a charge pump of the PLL to charge the control voltage so that the VCO speeds up. Likewise, if the phase of the VCO progresses ahead of the phase of the reference signal, the phase detector circuit causes the charge pump to change the control voltage to slow down the VCO. The low-pass filter smoothes out the abrupt control inputs from the charge pump. Since the frequency of the VCO may be far from the frequency of the reference signal, practical phase detectors may also respond to frequency differences, such as by using a phase frequency detector (PFD), so as to increase the lock-in range of allowable inputs.

As discussed above, most PLLs also include a frequency divider circuit between the VCO and the feedback input to the phase detector circuit in order to produce a frequency synthesizer. This frequency divider circuit may be programmable so as to achieve different output or feedback frequencies of the output signal. Some PLLs may also include a frequency divider circuit between the reference clock input and the reference input to the phase detector circuit. If this frequency divider circuit divides the frequency of the reference signal by M, the inclusion of this frequency divider circuit between the reference clock input and the reference input to the phase detector circuit allows the VCO to multiply the reference signal's frequency by N/M, where N is the multiplier provided by the VCO.

PLLs are used in a number of different ways in modern electronic systems. One use of PLLs is to provide clock signals for processors and other electronic devices. Typically, the clock signals supplied to these processors and other electronic devices come from clock generator PLLs which multiply a lower-frequency reference clock signal up to an operating frequency required by the processor or electronic device. Clock distribution logic may then distribute the clock signal generated by the PLL to various endpoints in the processor or electronic device.

With such clock generation PLLs, and other high-frequency PLLs, the operation of the high-frequency VCO is extremely important. Variability of VCO frequency with respect to temperature, as well as process variation and voltage changes, can have a significant effect on performance, cost, and yield. For example, Complementary Metal Oxide Semiconductor (CMOS) ring oscillators are commonly used for microprocessor clock generation and high speed input/output (I/O). These CMOS oscillators typically have a frequency sensitivity to temperature of about 0.1% to 0.2% per degree Celsius. This temperature variability makes certain intended uses of these CMOS oscillators in high-frequency PLLs not feasible. For example, operation in applications that require extremely wide temperature ranges, such as military specifications (mil-specs) of −55 degrees Celsius to +125 degrees Celsius may not be feasible.

SUMMARY

In view of the above, it is important to sense and monitor the operating temperature of integrated circuit devices, such as processors, chips, etc., so as to control the operation of the integrated circuit device, cooling system, and the high-frequency phase locked loops (PLLs) utilized by the integrated circuit device, chip, etc. The mechanisms of the illustrative embodiments provide an apparatus and method for utilizing a single set of one or more thermal sensors, e.g., thermal diodes, provided on the integrated circuit device, chip, etc., to control the operation of the integrated circuit device, associated cooling system, and high-frequency PLLs. By utilizing a single set of thermal sensors to provide multiple functions, e.g., controlling the operation of the integrated circuit device, the cooling system, and the PLLs, silicon real-estate usage is reduced through combining circuitry functionality. Moreover, the integrated circuit device yield is improved by reducing circuitry complexity and increasing PLL robustness to temperature. Furthermore, the PLL circuitry operating range is improved by compensating for temperature.

For purposes of illustration, it will be assumed that the mechanisms of the illustrative embodiments are implemented on an integrated circuit device having one or more thermal diodes formed thereon. With the mechanisms of the illustrative embodiments, the one or more thermal diodes provide voltage inputs to a temperature monitoring system-on-a-chip (SoC) which converts the voltage input to a digital value, such as via analog to digital conversion logic. The SoC, or a service processor coupled to the SoC, may convert this digital value to an operating temperature of the chip. The temperature monitoring SoC may itself, or via the help of the service processor, determine if the operating temperature corresponding to the voltage input represents a condition requiring a modification in the operation of the integrated circuit device. Such modification may be, for example, to change the processing load of the integrated circuit device, enter into a power saving mode, start the operation of a cooling system, shut down the integrated circuit device (such as for serious over temperature events), or the like.

In addition, such modification may include changing the operation of the voltage controlled oscillator (VCO) of one or more phase locked loops (PLLs) provided on the integrated circuit device to compensate for changes in temperature. It should be appreciated that in some cases the modification of the VCO of the PLLs may be performed even when modification to the processing load, power saving mode, cooling system operation, etc., is not performed. That is, temperature compensation in the PLLs of the integrated circuit device may be performed in a continuous manner, when the temperature exceeds a predetermined threshold, at regular intervals, or the like.

In one illustrative embodiment, a method for adjusting an operation of a phase locked loop (PLL) circuit based on a sensed temperature is provided. The method may comprise sensing an operational temperature of an integrated circuit device associated with the PLL circuit with one or more thermal sensors provided on the integrated circuit device. The one or more thermal sensors may be configured for use in controlling an operation of the integrated circuit device and an operation of the PLL circuit. The method may further comprise controlling an operation of the PLL circuit based on the operational temperature sensed by the one or more thermal sensors. An operation of the integrated circuit device may also be controlled based on the operational temperature sensed by the one or more thermal sensors, to thereby reduce the operational temperature of the integrated circuit device.

Controlling an operation of the integrated circuit device may comprise at least one of controlling a workload of the integrated circuit device, placing the integrated circuit device in a power saving mode of operation, shutting down operation of the integrated circuit device, or controlling an operation of a cooling system associated with the integrated circuit device. Controlling an operation of the PLL circuit may comprise generating a compensation voltage input signal to a voltage controlled oscillator of the PLL circuit based on the operational temperature. The compensation voltage input signal may modify a lock frequency range of the PLL circuit.

Sensing an operational temperature of the integrated circuit device may comprise retrieving calibration information for the integrated circuit device from a calibration information storage device of the integrated circuit device, the calibration information identifying temperature and voltage data for calibrating a thermal sensing monitoring mechanism. Sensing the operational temperature may further comprise determining a calibration curve based on the calibration information and comparing measured conditions of the integrated circuit device to the calibration curve to generate the operational temperature of the integrated circuit device.

The calibration information storage device may be a bank of electrical fuses (eFuses) that store data for two temperature points, the data comprising a temperature and a corresponding voltage across a thermal sensor at the temperature. The two temperature points may comprise a first temperature point at a low operating temperature extreme of the integrated circuit device and a second temperature point at a high operating temperature extreme of the integrated circuit device.

Sensing an operational temperature of an integrated circuit device may comprise generating at least one voltage using the one or more thermal sensors, providing the at least one voltage to a thermal monitoring mechanism, converting the at least one voltage to at least one digital value using the thermal monitoring mechanism, and generating an operational temperature value of the integrated circuit device based on the at least one digital value. The thermal monitoring mechanism may comprise at least one of a thermal monitoring system-on-a-chip or a service processor.

The one or more thermal sensors may comprise a plurality of thermal sensors and the at least one voltage may comprise a plurality of voltages. Converting the plurality of voltages to at least one digital value may comprise converting each voltage to a corresponding digital value, generating an average digital value, and generating the operational temperature of the integrated circuit device based on the average digital value.

The method may further comprise outputting the operational temperature value to a service processor and generating the operational temperature value of the integrated circuit device using the service processor and calibration information retrieved by the service processor. Moreover, the method may further comprise controlling an operation of the integrated circuit device based on the operational temperature sensed by the one or more thermal sensors, to thereby reduce the operational temperature of the integrated circuit device. Controlling an operation of the integrated circuit device based on the operational temperature may comprise generating, in the thermal monitoring mechanism, a control signal for controlling an operation of the integrated circuit device based on the operational temperature and outputting the control signal to a device associated with the integrated circuit device to control operations of the integrated circuit device to reduce the operating temperature of the integrated circuit device.

Generating a compensation voltage input signal to the PLL circuit may comprise receiving, in a slew rate limiter circuit, a voltage input directly from a thermal sensor, generating an output of the slew rate limiter circuit that is input to a voltage regulator circuit, and generating the compensation voltage input signal in the voltage regulator circuit which outputs the compensation voltage input signal to the voltage controlled oscillator of the PLL circuit.

In another illustrative embodiment, an apparatus for adjusting an operation of a phase locked loop (PLL) circuit based on a sensed temperature is provided. The apparatus may comprise one or more thermal sensors provided on an integrated circuit device, a thermal monitoring mechanism coupled to the one or more thermal sensors; and a PLL circuit coupled to the thermal monitoring mechanism. The one or more thermal sensors may be configured for use in controlling an operation of the integrated circuit device and an operation of the PLL circuit. An operational temperature of the integrated circuit device associated with the PLL circuit may be sensed with the one or more thermal sensors provided on the integrated circuit device. An operation of the PLL circuit may be controlled based on the operational temperature sensed by the one or more thermal sensors.

Moreover, an operation of the integrated circuit device may be controlled, based on the operational temperature sensed by the one or more thermal sensors, to thereby reduce the operational temperature of the integrated circuit device. The operation of the integrated circuit device may be controlled by at least one of controlling a workload of the integrated circuit device, placing the integrated circuit device in a power saving mode of operation, shutting down operation of the integrated circuit device, or controlling an operation of a cooling system associated with the integrated circuit device. The operation of the PLL circuit may be controlled by generating a compensation voltage input signal to a voltage controlled oscillator of the PLL circuit based on the operational temperature. The compensation voltage input signal may modify a lock frequency range of the PLL circuit.

The thermal monitoring mechanism may retrieve calibration information for the integrated circuit device from a calibration information storage device of the integrated circuit device, the calibration information identifying temperature and voltage data for calibrating a thermal sensing monitoring mechanism. The thermal monitoring mechanism may further determine a calibration curve based on the calibration information and compare measured conditions of the integrated circuit device to the calibration curve to generate the operational temperature of the integrated circuit device.

The one or more thermal sensors may generate at least one voltage based on the operational temperature of the integrated circuit device. The at least one voltage may be provided, by the one or more thermal sensors, to the thermal monitoring mechanism. The thermal monitoring mechanism may generate at least one digital value based on the at least one voltage. The thermal monitoring mechanism may generate an operational temperature value of the integrated circuit device based on the at least one digital value.

In yet another illustrative embodiment, a computer program product comprising a computer useable medium having a computer readable program is provided. The computer readable program, when executed on a computing device, may cause the computing device to receive an input from one or more thermal sensors provided on an integrated circuit device, the input corresponding to a sensed operational temperature of the integrated circuit device and control an operation of a phase locked loop (PLL) circuit provided on the integrated circuit device, based on the operational temperature sensed by the one or more thermal sensors.

These and other features and advantages of the present invention will be described in, or will become apparent to those of ordinary skill in the art in view of, the following detailed description of the exemplary embodiments of the present invention.

BRIEF DESCRIPTION OF THE DRAWINGS

The invention, as well as a preferred mode of use and further objectives and advantages thereof, will best be understood by reference to the following detailed description of illustrative embodiments when read in conjunction with the accompanying drawings, wherein.

DETAILED DESCRIPTION OF THE ILLUSTRATIVE EMBODIMENTS

The illustrative embodiments provide an apparatus and method for controlling the operation of an integrated circuit device based on detected operating temperature of the integrated circuit device. The operation of the integrated circuit device is controlled in at least two ways: controlling the integrated circuit device in one or more different ways to attempt to reduce the operating temperature of the integrated circuit device, and controlling an operation of one or more phase locked loops (PLLs) of the integrated circuit device so as to compensate for temperature. A single set of one or more thermal sensors provided on the integrated circuit device is used to provide a measure of the operating temperature of the integrated circuit device which is then used to control the operating temperature and operation of the PLLs of the integrated circuit device. The illustrative embodiments will be described in terms of using thermal diodes as the one or more temperature sensors through which voltage signals representative of a sensed temperature are obtained. However, it should be appreciated that other thermal sensors, including linear thermal resistors, digital thermal sensors, or the like, may be used without departing from the spirit and scope of the present invention.

Figure 1:
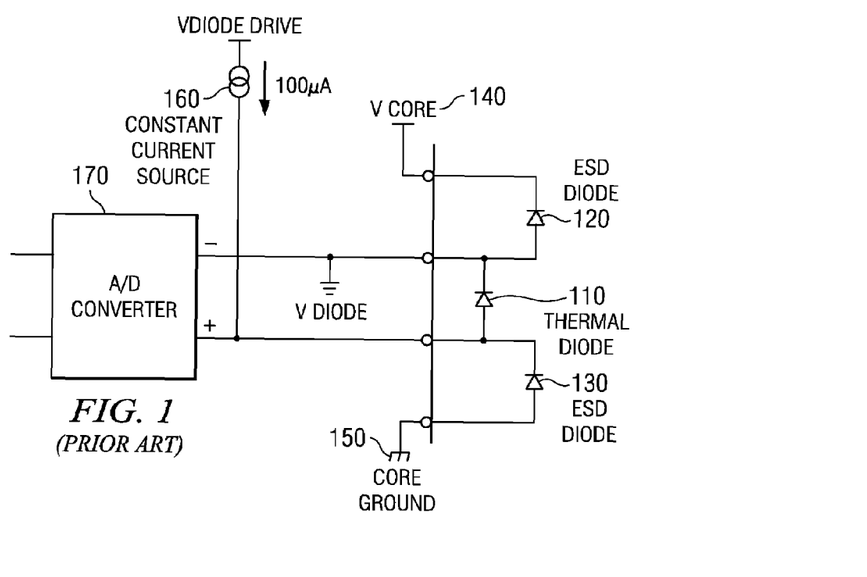
FIG. 1 is an exemplary block diagram of a known thermal diode with driver and sense circuitry.

FIG. 1 is an exemplary block diagram of a known thermal diode with driver and sense circuitry. The thermal diode in FIG. 1 is an example of a thermal diode available from International Business Machines Corporation of Armonk, N.Y., which is used in the PowerPC microprocessor family of processor chips. The diode is comprised of a small PN junction thermal diode 110 with attached electro-static discharge (ESD) diodes 120 and 130. One ESD diode 120 is coupled to a core voltage source 140 and the thermal diode 110. The other ESD diode 130 is coupled to a core ground 150 and the thermal diode 110. A constant current source 160 provides a constant current to the thermal diode 110.

When driven by the fixed current provided by the constant current source 160, the voltage developed across the thermal diode 110 varies according to the temperature of the thermal diode 110. The voltage across the thermal diode 110 is output to an analog to digital (A/D) converter 170. The A/D converter 170 converts the voltage output of the thermal diode 110 into a digital value which may then be converted to a temperature value based on a predetermined function.

The transfer equation of the thermal diode 110 is the standard diode equation. The thermal diode 110 is biased to operate in the linear region of the transfer equation's curve. Thus, the voltage across the diode, when driven by the constant current source 160, varies linearly according to the temperature of the thermal diode 110. The forward voltage of the thermal diode 110 drops as the temperature of the thermal diode 110 increases. This ratio is considered linear over the operational range of the integrated circuit device. The forward voltage drop of the thermal diode 110 is measured and converted to a temperature value.

Because of the possibility of changes to the semiconductor processes used to manufacture the integrated circuit device, the voltage versus temperature characteristics may shift, but will remain linear. In order to work around this manufacturing variable, each integrated circuit device contains thermal diode 110 calibration information. The calibration information, for example, consists of two temperature points and two corresponding diode voltages at the selected temperature. The voltage of the thermal diode 110 is measured and used to derive the temperature of the integrated circuit device. The voltage variation may range, for example, from 0.10 to 0.15 volts over the integrated circuit device operational temperature range. The calibration information is used to fix the slope and intercepts of the transfer equation curve. All of this information is brought together to create a function to describe the temperature of the integrated circuit device.

The calibration information for the integrated circuit device may be stored in a storage device (not shown) of the integrated circuit device, for example in a bank of electrical fuses (eFuses) of a fuse ring. For example, the eFuses, or fuse ring, may store temperature and voltage data determined during the manufacturing test process. This temperature and voltage data may be accessed by a thermal monitoring system during operation of the integrated circuit device. The data is stored, or fused in, at two temperature points, a low temperature at a lower temperature extreme of the integrated circuit device and a high temperature near the upper operating temperature extreme of the integrated circuit device. The storage device, e.g., a fuse ring, thus, contains two data values (x-y intercept) for each point, i.e. a temperature reading of the data point and corresponding voltage across the diode at this temperature. The points are used to plot a straight line curve between the points. The resulting straight line curve is used to plot temperature versus diode voltage for the thermal diode 110 and is used when calculating the resolution of the A/D converter 170.

Figure 2:
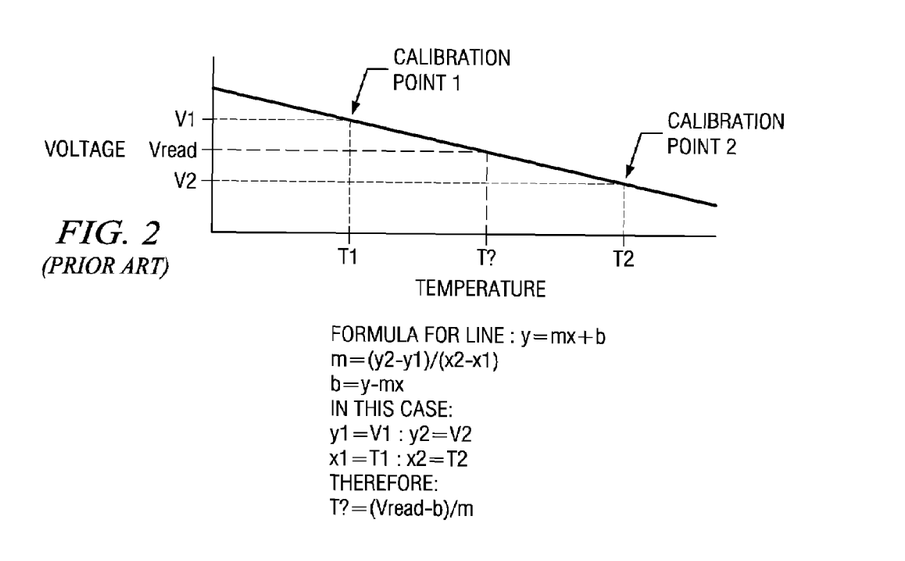
FIG. 2 is an exemplary diagram illustrating the use of a calibration curve to convert a thermal diode's voltage to a temperature value.

The voltage versus temperature calibration curve provides a linear relationship between the thermal diode's voltage output and a corresponding operating temperature of the integrated circuit device. As shown in FIG. 2, simple linear mathematics may be used when converting the thermal diode's voltage to the corresponding operating temperature. FIG. 2 is an exemplary diagram illustrating the use of a calibration curve to convert a thermal diode's voltage to a temperature value. The relationships illustrated in FIG. 2 may be encoded in a temperature monitoring system and may be used to perform the conversion from voltage to temperature value.

Figure 3:
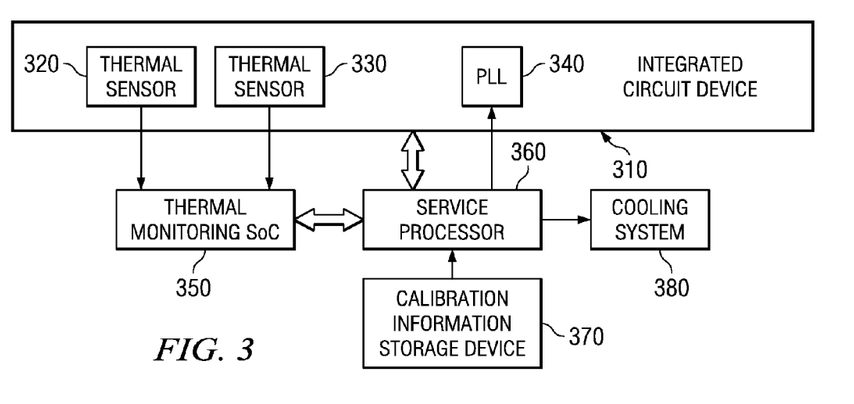
FIG. 3 is an exemplary block diagram of a system-on-a-chip based thermal monitoring system in accordance with one illustrative embodiment.

FIG. 3 is an exemplary block diagram of a system-on-a-chip based thermal monitoring system in accordance with one illustrative embodiment. As shown in FIG. 3, an integrated circuit device 310 having one or more thermal sensors 320 and 330, which in this case are thermal diodes such as illustrated in FIG. 1, is coupled to a thermal monitoring system-on-a-chip (SoC) 350 and a service processor 360. In addition, the integrated circuit device 310, which may be, for example, a microprocessor or the like, may further include one or more phase locked loops (PLLs) 340 coupled to the service processor 360 or thermal monitoring SoC 350. The thermal sensors 320 and 330 provide voltage output signals, corresponding to an operating temperature of the integrated circuit device 310 sensed by the thermal sensors 320 and 330, to the thermal monitoring SoC 350 which generates a digital value corresponding to the voltage output signals. For example, more than one digital value may be generated for each voltage reported by each of the thermal sensors 320 and 330, an average digital value may be generated based on an average of the two voltage output signals, or the like. The digital values may be generated by the thermal monitoring SoC 350 using an A/D converter, such as the A/D converter 170 shown in FIG. 1.

The digital value generated by the thermal monitoring SoC 350, in one illustrative embodiment, is provided to the service processor 360 which uses the calibration information stored in the calibration information storage device 370 and the voltage to temperature conversion relationship discussed above to convert the digital value to a corresponding temperature. The service processor 360 may further generate one or more control signals based on a comparison of the temperature value derived from the voltage output of the thermal sensors 320 and 330 to one or more predetermined temperature thresholds. The control signals may be sent to the integrated circuit device 310, the cooling system 380, or the like, to control the operation of the integrated circuit device 310 and/or cooling system 380 so as to reduce the operating temperature of the integrated circuit device 310.

For example, the control signals may cause the integrated circuit device 310 to reduce tasks performed by the integrated circuit device to thereby reduce the processing load of the integrated circuit device 310, enter into a power saving mode, shut the integrated circuit device 310 down due to a serious over-temperature condition or event, or the like. The control signals may cause the cooling system 380 to turn on to thereby cool the integrated circuit device 310 and thus, reduce the operating temperature of the integrated circuit device 310.

Moreover, control signals may be sent to the PLL 340 to adjust the operation of the PLL 340 to compensate for the operating temperature of the integrated circuit device 310, as discussed hereafter. It should be appreciated that the control signals sent to the PLL 340 may be sent regardless of the results of the comparison of the derived temperature value to the predetermined temperature thresholds. That is, even when control signals are not sent to the integrated circuit device 310 or the cooling system 380 because reduction in the operating temperature of the integrated circuit device 310 is not necessary, control signals may be sent to the PLL 340 so as to adjust the PLL's operation to compensate for the operating temperature of the integrated circuit device 310.

With regard to controlling the operating temperature of the integrated circuit device 310, the basic functions of the temperature monitoring system shown in FIG. 3 are to read the voltage of the thermal sensors 320 and 330 provided on the integrated circuit device 310, send the resulting voltage information to the service processor 360, have the service processor 360 calculate the temperature of the integrated circuit device 310, and react to the temperature information by providing control signal outputs if necessary. With regard to controlling the operation of the PLL 340, the basic functions of the temperature monitoring system shown in FIG. 3 are to read the voltage of the thermal sensors 320 and 330 provided on the integrated circuit device 310, send the resulting voltage information to the service processor 360, have the service processor 360 calculate the temperature of the integrated circuit device 310, and provide control signals to the PLL 340 to adjust the operation of the PLL 340 to compensate for the operating temperature of the integrated circuit device 310.

It should be noted that, in the depicted example, the temperature of the integrated circuit device 310 is calculated by the service processor 360 which also determines control signals to be output to control the operating temperature of the integrated circuit device 310 and the operation of the PLL 340. However, the calculation of the temperature and generation of control signals may be performed by other elements provided in association with the integrated circuit device 310. For example, in one illustrative embodiment, these functions may all be performed by the thermal monitoring SoC 350. In such an embodiment, the thermal monitoring SoC 350 may have access to the calibration information in the calibration information storage device 370. Alternatively, the service processor 360 may collect the calibration information and provide the calibration information to the thermal monitoring SoC 350 during a boot process, or the like, which may then use this information to perform temperature calculations.

With regard to the controlling of the operation of a PLL 340 based on the detected operating temperature of the integrated circuit device 310 as determined from the voltage output of the thermal sensors 320 and 330, the detected operating temperature may be used to generate a voltage compensation signal to be input to the voltage controlled oscillator (VCO) of the PLL 340. In one illustrative embodiment, the service processor 360, or the thermal monitoring SoC 350 may provide a voltage proportional to absolute temperature (PTAT) circuit for generating a compensation voltage signal that is input to the VCO of the PLL 340. In other illustrative embodiments, the voltage output of the thermal sensors 320 and 330 themselves may be provided directly to the VCO, i.e. without having to go through the thermal monitoring SoC 350 or service processor 360.

Figure 4:
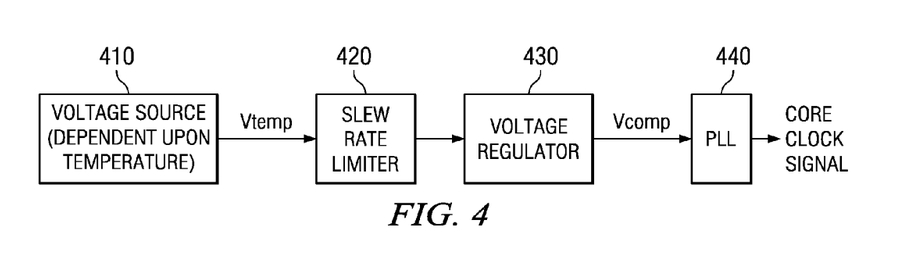
FIG. 4 is an exemplary block diagram of a circuit for adjusting the operation of a phase locked loop (PLL) based on operating temperature of the integrated circuit device in accordance with one illustrative embodiment.

FIG. 4 is an exemplary block diagram of a circuit for adjusting the operation of a PLL based on operating temperature of the integrated circuit device in accordance with one illustrative embodiment. As shown in FIG. 4, the circuit comprises a voltage source dependent upon temperature 410, a slew rate limiter 420, a voltage regulator 430, and a PLL 440. The slew rate limiter 420 receives a voltage input from the voltage source 410, the voltage input being representative of a measured temperature of an integrated circuit device associated with the PLL 440. For example, the voltage source 410 may be a thermal sensor, a voltage PTAT, or the like. The slew rate limiter 420 adjusts the voltage input signal so as to prevent the voltage regulator 430 from experiencing sudden changes in its control input by limiting the slope of the voltage transition. The voltage regulator 430 is used to maintain a constant voltage level, as set by the voltage source 410 via the slew rate limiter 420, that is input to the PLL 440. This constant voltage level is referred to herein as the compensation voltage Vcomp which is input to the VCO of the PLL 440 to control the operation of the PLL 440 to compensate for the measured temperature of the integrated circuit device.

Figure 5:
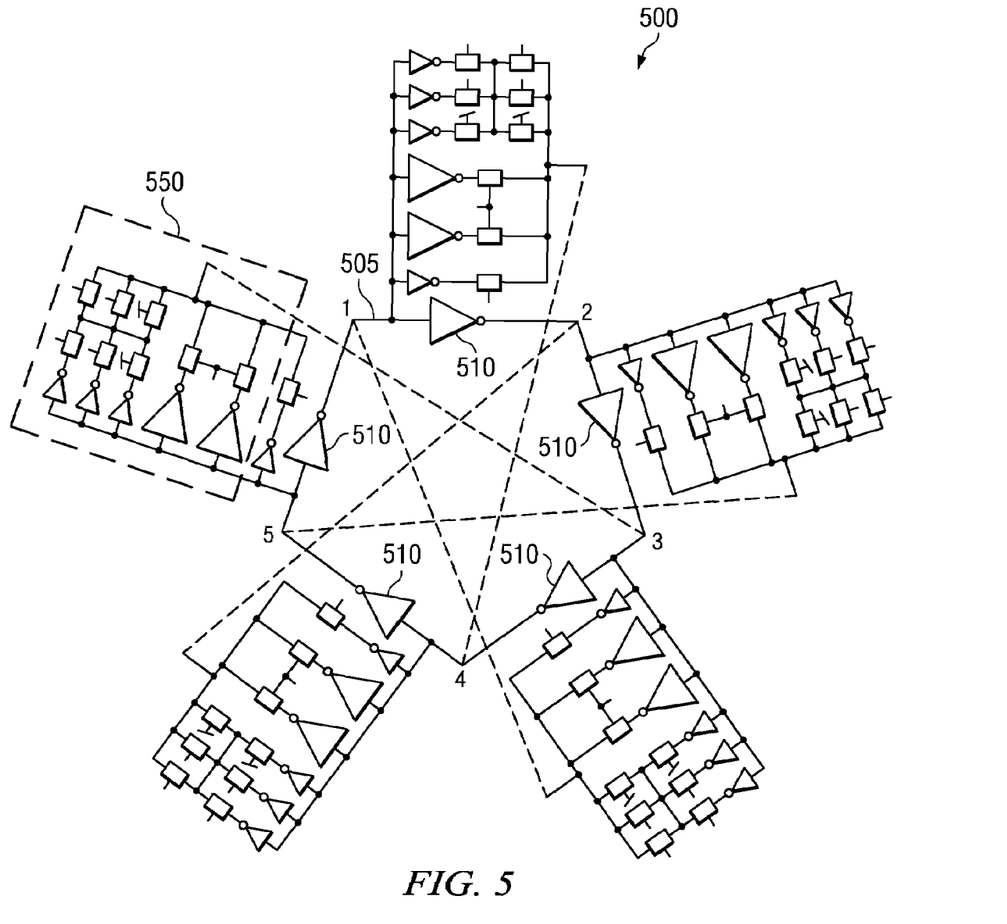
FIG. 5 is an exemplary diagram of an interleaved voltage controlled oscillator (VCO) which may be used in a PLL that has temperature compensation in accordance with one illustrative embodiment.

FIG. 5 is an exemplary diagram of an interleaved VCO which may be used in a PLL that has temperature compensation in accordance with one illustrative embodiment. As shown in FIG. 5, the VCO 500 comprises a ring circuit 505 which itself comprises a series of connections of main logic inverter gates 510 and a plurality of delay elements, as shown within the area indicated by reference numeral 550. Each delay element 550 is connected in parallel with a selected sequence of the main logic inverter gates 510. In one illustrative embodiment, the VCO 500 comprises components manufactured with 65 nanometer (nm) technology employing a lithographic mode of manufacture. While the illustrative embodiments comprise components manufactured with 65 nm technology, it will be appreciated that the scope of the illustrative embodiments is not limited to such and that the mechanisms of the illustrative embodiments may also apply to VCO systems using components manufactured with other technologies, such as 45 nm, 90 nm, 130 nm, and other technologies, for example.

Figure 6:
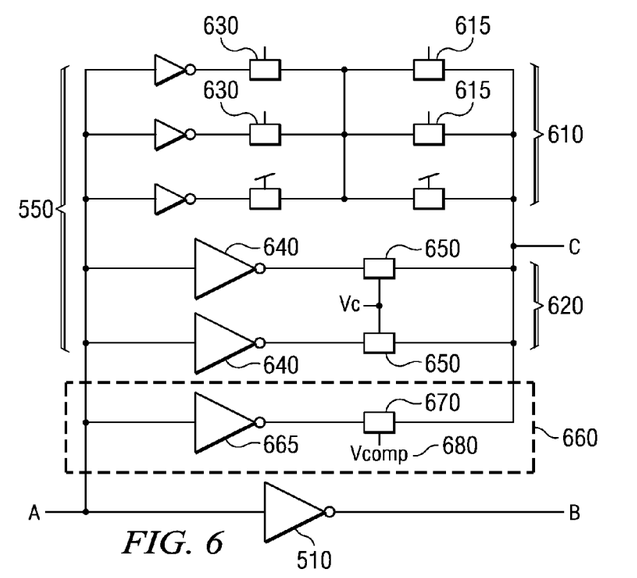
FIGS. 6 and 7 provide exemplary diagrams of delay elements which may be used in a VCO of a PLL in accordance with one illustrative embodiment.
Figure 7:
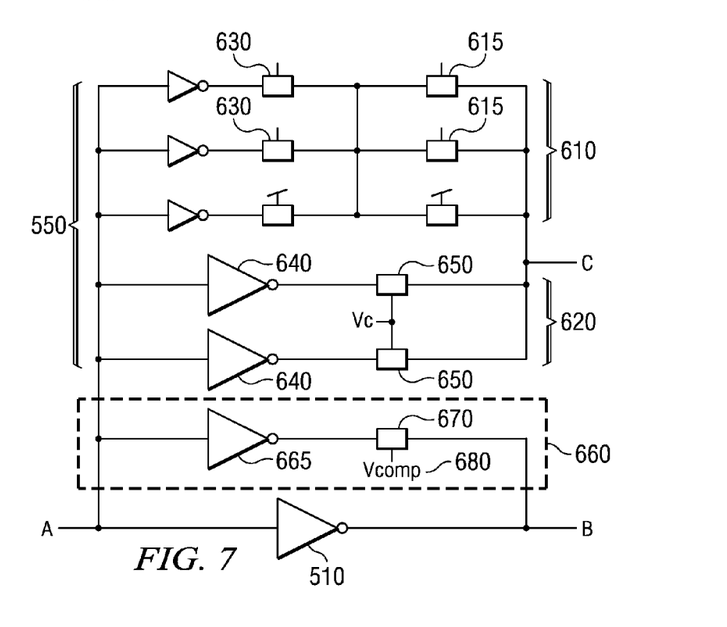

FIGS. 6 and 7 provide exemplary diagrams of the delay elements 550 which may be used in the VCO 500 of FIG. 5. Each delay element 550 may comprise a feed-forward section 610 and a proportional section 620. In one illustrative embodiment, the feed-forward section 610 comprises controls 630 for regulating signal transmission through the feed-forward elements 615 responsive to one or more control voltages. The proportional section 620 may comprise controls 640 for regulating signal transmission through at least one logic inverter gate 650.

In one illustrative embodiment, the VCO 500 comprises at least one temperature compensation circuit 660. Each temperature compensation circuit 660 comprises a logic inverter gate 665 in series connection with one or more field effect transistors (FETs) 670. The FET 670 is responsive to the compensating voltage input Vcomp 680 which is proportional to the detected temperature, as detected by the thermal sensors, e.g., thermal sensors 320 and 330 in FIG. 3, of the integrated circuit device associated with the PLL in which the VCO 500 is utilized. As the compensating voltage input Vcomp 680 increases, a conductance value of the FET 670 increases and thus, the current flow through the logic inverter gate 665 also increases.

With specific reference to FIG. 6, the temperature compensation circuit 660 is in signal communication with the voltage source 410 in FIG. 4 configured to provide a voltage signal responsive to temperature and in parallel connection with the delay element 550. In an alternative illustrative embodiment, as shown in FIG. 7, the temperature compensation circuit 660 is in parallel connection to at least one of the main logic inverter gates 510 of the ring circuit 505.

It will be appreciated that, in an exemplary embodiment such as depicted in FIG. 6, the connection of the logic inverter gate 665 in parallel with logic gates in proportional section 620 of similar size provides that the contribution of effect of the logic inverter gate 665 can be significant to the overall delay element 550. Similarly, it will be appreciated that, in another exemplary embodiment such as depicted in FIG. 7, the connection of the logic inverter gate 665 in parallel with the main logic inverter gate 510 of greater size provides that the contribution effect of the logic inverter gate 665 will be small as compared to that of the main logic inverter gates 510. It will therefore be appreciated by one skilled in the art that for a given change in value of the compensating voltage input Vcomp 680, the exemplary embodiment in FIG. 6 will provide a greater compensation effect than the exemplary embodiment in FIG. 7. Accordingly, an exemplary embodiment of the present invention utilizing the arrangement in FIG. 6 can provide compensation over a greater range of operating temperatures, while an exemplary embodiment of the present invention utilizing the arrangement in FIG. 7 can provide a finer resolution of compensation over a more narrow range of operating temperatures.

Figure 8:
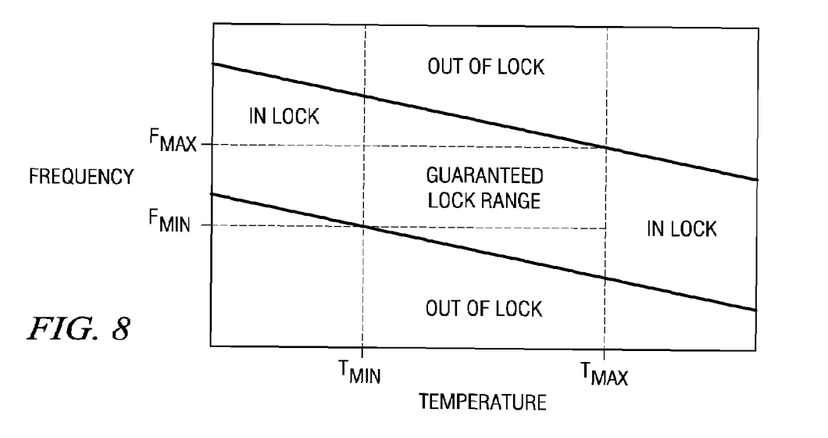
FIG. 8 is an exemplary plot illustrating a locking range of a PLL and its dependency on temperature.

As discussed above, the PLL frequency is dependent upon temperature. The wide temperature operation of a chip can cause the PLL circuit to not lock or fail to lock at a given temperature. However, the maximum and minimum frequency of the PLL circuit is also dependent upon the voltage input to the PLL circuit. FIG. 8 is an exemplary plot illustrating the PLL locking frequency range in relation to temperature. As shown in FIG. 8, there is a range between the PLL circuit's minimum frequency (Fmin) and maximum frequency (Fmax), and the PLL circuit's minimum temperature (Tmin) and maximum temperature (Tmax) in which the PLL is guaranteed to lock. As the temperature of an integrated circuit device increases, the frequency range in which guaranteed locking of the PLL is possible is reduced leading to failures of the PLL to lock. For example, the Fmax value in FIG. 8 is reduced as Tmax is increased, thereby reducing the upper limit in the locking range. By dynamically adjusting the compensation voltage Vcomp, the temperature relationship to the locking frequency can be reduced, thereby increasing the locking frequency range.

By adjusting the voltage input, the temperature dependency of the PLL can be compensated for. The temperature compensation mechanisms discussed above help to adjust the operation of the PLL to compensate for the operating temperature of the integrated circuit device. In addition to this adjustment, the mechanisms of the illustrative embodiments further adjust the voltage input to the PLL circuit to improve the robustness of the PLL. This additional adjustment is based on the observation that the PLL circuit's Fmin and Fmax correlate to the frequency of the integrated circuit device. The relationship between the PLL's allowable locking frequency and the speed of the integrated circuit device poses a dilemma for an integrated circuit device to operate with a single voltage input.

As with the temperature compensation for the PLL, as discussed above, the PLL adjustment due to frequency of the integrated circuit device may be made using mechanisms of the illustrative embodiments. As is generally known in the art, a microprocessor's power performance is greatly affected by process variation. This requires the microprocessors to be operated at different voltages to attain a suitable power and frequency. This voltage information defines the operating voltage for the final system.

The integrated circuit device may be tested in a manner generally known in the art to determine the frequency of the integrated circuit device. This frequency information may then be stored in the calibration information storage device 370 in FIG. 3. This frequency information defines a nominal voltage input based on the tested frequency. This voltage input information may then be used by the thermal monitoring SoC or the service processor as an offset voltage for determining a compensation voltage Vcomp to be input to the VCO of the PLL. That is, the Vcomp value may be increased or decreased based on the nominal voltage determined during testing and stored in the calibration information storage device 370.

Figure 9:
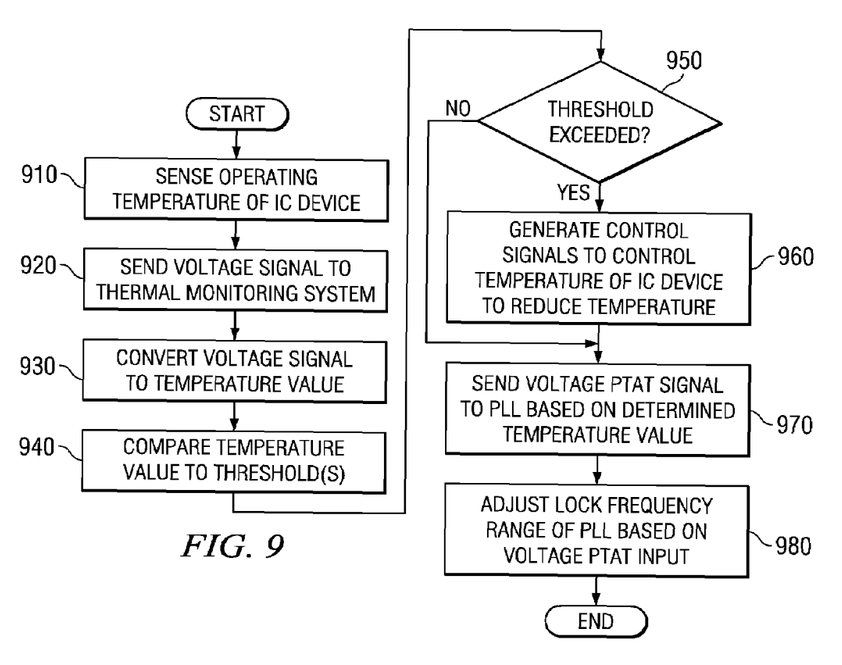
FIG. 9 is a flowchart outlining an exemplary operation of one illustrative embodiment when compensating for temperature in both the operation of an integrated circuit device to thereby reduce the operating temperature, and the operation of a PLL of the integrated circuit device.

FIG. 9 is a flowchart outlining an exemplary operation of one illustrative embodiment when compensating for temperature in both the operation of an integrated circuit device to thereby reduce the operating temperature, and the operation of a PLL of the integrated circuit device. The operation outlined in FIG. 9 may be performed continuously, periodically, or in response to the occurrence of certain events, e.g., workload increasing above a predetermined threshold, a scheduled set of time points at which the operation is to be performed, etc.

As shown in FIG. 9, the operation starts with the sensing of an operating temperature of the integrated circuit device using one or more thermal sensors (step 910). The one or more thermal sensor sends a voltage signal to a thermal monitoring system (step 920) which converts the voltage signal to a temperature value (step 930). The thermal monitoring system compares the temperature value to one or more threshold values (step 940) and determines if the one or more threshold values are exceeded (step 950). If a threshold value is exceeded, appropriate control signals are generated and sent to the integrated circuit device and/or a cooling system to reduce the operating temperature of the integrated circuit device (step 960).

In addition, thereafter, or if the one or more threshold values are not exceeded, a voltage proportional to absolute temperature (PTAT) signal is provided to a PLL of the integrated circuit device (step 970). As discussed above, this voltage PTAT signal may be adjusted based on a nominal voltage determined during manufacture testing. The voltage PTAT signal is received by the PLL which adjusts its frequency range for locking (step 980). The operation then terminates.

The circuit as described above is part of the design for an integrated circuit chip. The chip design is created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multi-chip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor. Moreover, the end products in which the integrated circuit chips may be provided may include game machines, game consoles, hand-held computing devices, personal digital assistants, communication devices, such as wireless telephones and the like, laptop computing devices, desktop computing devices, server computing devices, or any other computing device.

It should further be appreciated that aspects of the illustrative embodiments may take the form of an entirely hardware embodiment, an entirely software embodiment or an embodiment containing both hardware and software elements. In one exemplary embodiment, the operation of the thermal monitoring mechanisms. e.g., thermal monitoring SoC 350, and the service processor 360, and the like, may be implemented in software, which includes but is not limited to firmware, resident software, microcode, etc.

Furthermore, certain aspects of the illustrative embodiments may take the form of a computer program product accessible from a computer-usable or computer-readable medium providing program code for use by or in connection with a computer or any instruction execution system. For the purposes of this description, a computer-usable or computer-readable medium can be any apparatus that can contain, store, communicate, propagate, or transport the program for use by or in connection with the instruction execution system, apparatus, or device.

The medium may be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk-read-only memory (CD-ROM), compact disk-read/write (CD-R/W) and DVD.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A method for adjusting an operation of a phase locked loop (PLL) circuit based on a sensed temperature, comprising:
    sensing an operational temperature of an integrated circuit device associated with the PLL circuit with one or more thermal sensors provided on the integrated circuit device, wherein the one or more thermal sensors are configured for use in controlling an operation of the integrated circuit device and an operation of the PLL circuit;
    controlling an operation of the PLL circuit based on the operational temperature sensed by the one or more thermal sensors;
    generating a compensation voltage input signal to a voltage controlled oscillator of the PLL circuit based on the operational temperature, wherein the compensation voltage input signal modifies a lock frequency range of the PLL circuit, wherein sensing an operational temperature of an integrated circuit device comprises:
    generating at least one voltage using the one or more thermal sensors;
    providing the at least one voltage to a thermal monitoring mechanism;
    converting the at least one voltage to at least one digital value using the thermal monitoring mechanism; and
    generating an operational temperature value of the integrated circuit device based on the at least one digital value, and wherein the one or more thermal sensors comprise a plurality of thermal sensors and the at least one voltage comprises a plurality of voltages, and wherein converting the plurality of voltages to at least one digital value comprises:
    converting each voltage to a corresponding digital value;
    generating an average digital value; and
    generating the operational temperature of the integrated circuit device based on the average digital value.

2. The method of claim 1, further comprising:
    controlling an operation of the integrated circuit device based on the operational temperature sensed by the one or more thermal sensors, to thereby reduce the operational temperature of the integrated circuit device.

3. The method of claim 2, wherein controlling an operation of the integrated circuit device comprises at least one of controlling a workload of the integrated circuit device, placing the integrated circuit device in a power saving mode of operation, shutting down operation of the integrated circuit device, or controlling an operation of a cooling system associated with the integrated circuit device.

4. The method of claim 1, wherein sensing an operational temperature of the integrated circuit device comprises:
    retrieving calibration information for the integrated circuit device from a calibration information storage device of the integrated circuit device, the calibration information identifying temperature and voltage data for calibrating a thermal sensing monitoring mechanism;
    determining a calibration curve based on the calibration information; and
    comparing measured conditions of the integrated circuit device to the calibration curve to generate the operational temperature of the integrated circuit device.

5. The method of claim 4, wherein the calibration information storage device is a bank of electrical fuses (eFuses) that store data for two temperature points, the data comprising a temperature and a corresponding voltage across a thermal sensor at the temperature.

6. The method of claim 5, wherein the two temperature points comprise a first temperature point at a low operating temperature extreme of the integrated circuit device and a second temperature point at a high operating temperature extreme of the integrated circuit device.

7. The method of claim 1, wherein the thermal monitoring mechanism comprises at least one of a thermal monitoring system-on-a-chip or a service processor.

8. The method of claim 1, further comprising:
    outputting the operational temperature value to a service processor; and
    generating the operational temperature value of the integrated circuit device using the service processor and calibration information retrieved by the service processor.

9. The method of claim 1, further comprising controlling an operation of the integrated circuit device based on the operational temperature sensed by the one or more thermal sensors, to thereby reduce the operational temperature of the integrated circuit device, wherein controlling an operation of the integrated circuit device based on the operational temperature, comprises:
    generating, in the thermal monitoring mechanism, a control signal for controlling an operation of the integrated circuit device based on the operational temperature; and
    outputting the control signal to a device associated with the integrated circuit device to control operations of the integrated circuit device to reduce the operating temperature of the integrated circuit device.

10. The method of claim 1, wherein generating a compensation voltage input signal to the PLL circuit comprises:
    receiving, in a slew rate limiter circuit, a voltage input directly from a thermal sensor;
    generating an output of the slew rate limiter circuit that is input to a voltage regulator circuit; and
    generating the compensation voltage input signal in the voltage regulator circuit which outputs the compensation voltage input signal to the voltage controlled oscillator of the PLL circuit.

11. The method of claim 1, wherein the plurality of thermal sensors are provided on the integrated circuit device, the PLL circuit is provided on the integrated circuit device, and the thermal monitoring system is a system-on-a-chip separate and external to the integrated circuit device.

12. The method of claim 11, wherein a service processor, that is separate and external to the integrated circuit device, generates the operational temperature value of the integrated circuit device based on the at least one digital value.

13. The method of claim 12, wherein the service processor receives the at least one digital value from the thermal monitoring system, and wherein the service processor controls a cooling system associated with the integrated circuit device.

* * * * *